(12) United States Patent
Aoki

(10) Patent No.: US 8,395,758 B2
(45) Date of Patent: Mar. 12, 2013

(54) EXPOSURE APPARATUS AND DEVICE MANUFACTURING METHOD

(75) Inventor: Yasuo Aoki, Zushi (JP)

(73) Assignee: Nikon Corporation, Tokyo (JP)

( * ) Notice: Subject to any disclaimer, the term of this patent is extended or adjusted under 35 U.S.C. 154(b) by 450 days.

(21) Appl. No.: 12/781,110

(22) Filed: May 17, 2010

(65) Prior Publication Data

US 2010/0304307 A1    Dec. 2, 2010

(30) Foreign Application Priority Data

May 15, 2009  (JP) ................................. 2009-118204
May 14, 2010  (JP) ................................. 2010-112371

(51) Int. Cl.
  *B64C 17/06*   (2006.01)
  *G03B 27/32*   (2006.01)
  *G03B 27/42*   (2006.01)
  *G03B 27/58*   (2006.01)
  *G03B 27/62*   (2006.01)

(52) U.S. Cl. ......... 355/72; 310/12.06; 318/649; 355/53; 355/75; 355/77

(58) Field of Classification Search .... 310/12.05–12.06; 318/649; 355/53, 72, 75, 77
See application file for complete search history.

(56) References Cited

U.S. PATENT DOCUMENTS 5,969,441 A    10/1999  Loopstra et al.
6,208,407 B1    3/2001  Loopstra
6,408,045 B1    6/2002  Matsui et al.
6,552,775 B1    4/2003  Yanagihara et al.
6,590,634 B1    7/2003  Nishi et al.
6,611,316 B2    8/2003  Sewell (Continued)

FOREIGN PATENT DOCUMENTS

JP    A-63-259492    10/1988
JP    A-1-165116     6/1989

(Continued)

OTHER PUBLICATIONS

International Search Report dated Aug. 17, 2010 in International Patent Application No. PCT/JP2010/003302 (with translation).

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

While one ends of ropes are respectively tied to a −Y side leg section and a +Y side leg section of a frame caster, the other ends of the ropes hang down in a −Z direction via a plurality of pulleys fixed to the upper sections of frames that are each separated from an apparatus main body, and a weight having a weight corresponding to a half the weight to be reduced is tied to each of the other ends. In this case, even if the apparatus main body oscillates in vertical or lateral directions (normal directions of the pulleys) owing to the action of a vibration isolation table, the position of the weight only vertically moves by rotation of the pulleys, and the reduced amount of the apparatus weight does not vary. Further, since any coil springs are not used, sympathetic vibration with the apparatus main body and the vibration isolation table does not occur, which allows the attenuation characteristics of the vibration isolation table to be improved. Therefore, the exposure apparatus can be increased in size without inducing the cost rise.

27 Claims, 7 Drawing Sheets

U.S. PATENT DOCUMENTS

| | | |
|---|---|---|
| 6,778,257 B2 | 8/2004 | Bleeker et al. |
| 7,023,610 B2 | 4/2006 | Ohtsuki et al. |
| 2005/0259234 A1 | 11/2005 | Hirukawa et al. |
| 2008/0030702 A1 | 2/2008 | Kawamura |
| 2008/0068568 A1 | 3/2008 | Ebihara et al. |
| 2009/0207396 A1* | 8/2009 | Melzer et al. ............ 355/67 |
| 2010/0018950 A1 | 1/2010 | Aoki et al. |
| 2011/0267596 A1* | 11/2011 | Muehlberger et al. ....... 355/67 |

FOREIGN PATENT DOCUMENTS

| | | |
|---|---|---|
| JP | A-11-145041 | 5/1999 |
| JP | A-11-297613 | 10/1999 |
| WO | WO 01/35168 A1 | 5/2001 |
| WO | WO 2005/074014 A1 | 8/2005 |
| WO | WO 2008/129762 A1 | 10/2008 |

OTHER PUBLICATIONS

English language translation of previously-submitted WO 2005/074014 A1.

Aug. 17, 2010 Written Opinion issued in Application No. PCT/JP2010/003302 (with English translation).

\* cited by examiner

EXPOSURE APPARATUS AND DEVICE MANUFACTURING METHOD

BACKGROUND OF THE INVENTION

1. Field of the Invention

The present invention relates to exposure apparatuses and device manufacturing methods, and more particularly to an exposure apparatus that exposes an object with an energy beam and forms a pattern on the object, and a device manufacturing method that uses the exposure apparatus.

2. Description of the Background Art

Conventionally, in a lithography process for manufacturing electron devices (microdevices) such as liquid crystal display elements or semiconductor devices (integrated circuits or the like), an exposure apparatus such as a projection exposure apparatus by a step-and-repeat method (a so-called stepper), or a projection exposure apparatus by a step-and-scan method (a so-called scanning stepper (which is also called a scanner)) is mainly used.

In this type of exposure apparatus, illumination light is irradiated on a mask (or a reticle) on which a pattern is formed, and the pattern is projected on a substrate (such as a glass plate or a wafer) that is coated with a sensitive agent (resist), via a projection optical system, and thereby the pattern is respectively transferred onto a plurality of shot areas. Then, by overlaying and forming plural layers of patterns on the substrate, the electron device referred to above is manufactured. Therefore, it is necessary to accurately overlay and form a pattern of the mask on the pattern already formed on the substrate. Vibration of the exposure apparatus or the like is a factor that degrades the overlay accuracy. Accordingly, in order to restrain the vibration from the outside such as a floor from being transmitted to the apparatus, an exposure apparatus main body is installed on a plurality of vibration isolation tables (e.g. refer to PCT International Publication NO. 2008/129762). In this case, the vibration isolation table means a member that has a role of restraining transmission of the vibration from the outside of the apparatus (such as the floor) to the apparatus main body, and is also called a vibration elimination table. There are two types of the vibration isolation tables, which are a passive type and an active type.

However, the exposure apparatus is growing in size with the times, and the vibration isolation table is similarly growing in size according to the size increase of the exposure apparatus, which leads to the cost rise. Further, as a vibration isolation table in order to reduce the load placed on the vibration isolation table, a vibration isolation table having a structure in which coil springs are increased in number and the apparatus main body is supported by the coil springs is also known. However, when the stiffness of the vibration isolation table is too high, the vibration isolating effect decreases instead.

Further, the exposure apparatus described in, for example, PCT International Publication No. 2008/129762, or the like is equipped with a plurality of image-forming optical systems. It is usual that the plurality of image-forming optical systems are fixed to (held on) one surface plate (which is called an optical surface plate) because correction of the positional relation among them becomes difficult if some of the plurality of image-forming optical systems are relatively translated or have rotational displacement with respect to the other image-forming optical systems. In order to restrain local deformation of the optical surface plate, typically, the optical surface plate is supported at support points (hinged joint support sections) in a plurality of positions, e.g. three positions that form one plane, on the exposure apparatus main body.

However, the optical surface plate to which the plurality of image-forming optical systems are attached is heavy in weight and has a low stiffness, and therefore, in practice, when the exposure apparatus main body deforms, the hinged joint support sections in three positions are prevented from freely rotating, because of a frictional force caused by the empty weight of the optical surface plate and the plurality of image-forming optical systems, and as a consequence, the optical surface plate locally deforms and the relative displacement (mainly, the relative angle displacement) among the plurality of image-forming optical systems occurs, which degrades the optical performance in some cases. Therefore, a method has been employed in which in order to reduce the resistance by the frictional force at the hinged joint support sections by cancelling a part of the empty weight, helical compression springs are placed near the support points to supplementary support the optical surface plate from the apparatus main body side.

However, since the spring constant of the helical compression spring is comparatively large, there is a risk that the helical compression spring degrades the apparatus performance because the support force of the helical compression spring varies owing to the apparatus deformation, or excites vibration because the helical compression spring has the eigenfrequency.

SUMMARY OF THE INVENTION

According to a first aspect of the present invention, there is provided an exposure apparatus that exposes an object with an energy beam and forms a pattern on the object, the apparatus comprising: an exposure apparatus main body that performs exposure of the object; and a weight reduction device, a part of which is connected to a supported section that includes at least a part of the exposure apparatus main body, and which generates a lifting force to lift the supported section upward by making use of an empty weight of a heavy load, and reduces a weight acting on a supporting section that supports the supported section from below.

With this apparatus, the weight acting on the supporting section that supports the supported section including at least a part of the exposure apparatus main body can be reduced, with a simple configuration. Therefore, for example, even if the size of the exposure apparatus main body is increased, it is not necessary to increase the size of the vibration isolation table or to increase the stiffness of the vibration isolation table more than needed, according to the size increase of the exposure apparatus main body. Consequently, the exposure apparatus main body can be increased in size without inducing the cost rise.

According to a second aspect of the present invention, there is provided a device manufacturing method, comprising: exposing an object using the exposure apparatus of the present invention; and developing the object that has been exposed.

In this case, there is provided a manufacturing method of manufacturing a flat-panel display as a device, by using a substrate for a flat-panel display as an object. The substrate for a flat-panel display includes a membrane-like member besides a glass substrate and the like.

BRIEF DESCRIPTION OF THE DRAWINGS

In the accompanying drawings.

DESCRIPTION OF THE EMBODIMENTS

First Embodiment

Figure 1:
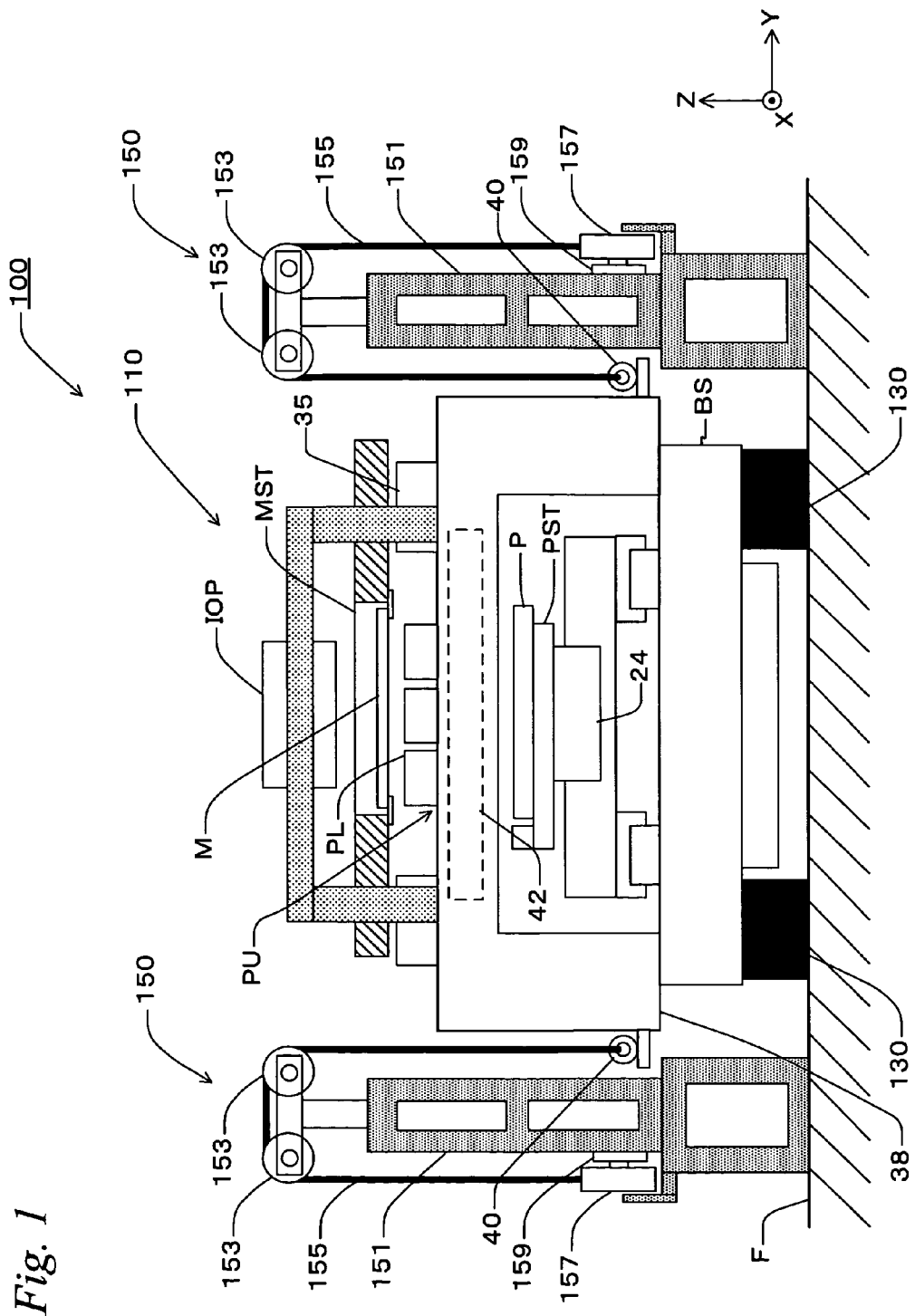
FIG. 1 is a view showing a schematic configuration of an exposure apparatus of a first embodiment.
Figure 2:
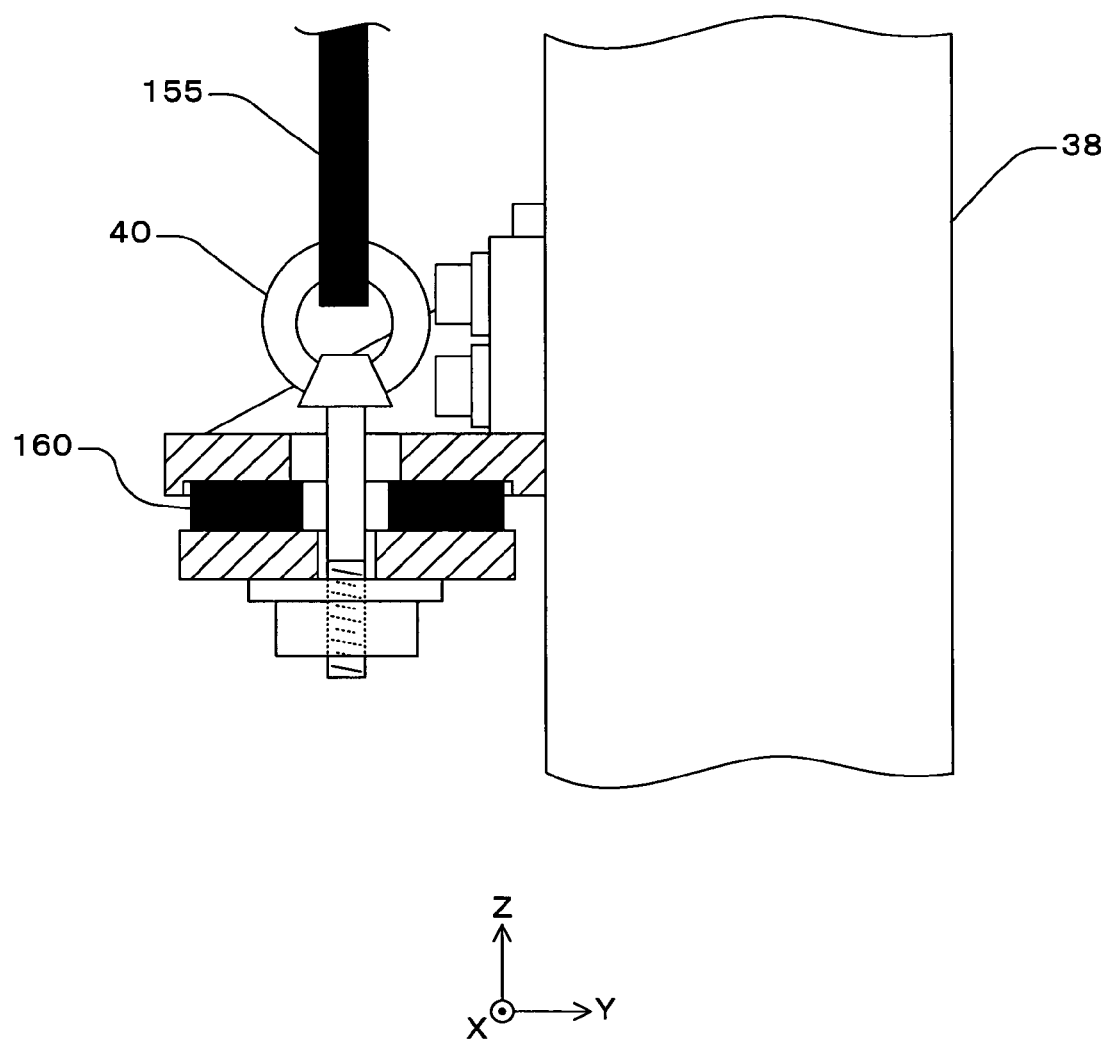
FIG. 2 is an enlarged view of a tying section between an exposure apparatus main body and a rope.

A first embodiment of the present invention is described below, with reference to FIGS. 1 and 2. FIG. 1 shows a schematic configuration of a liquid crystal exposure apparatus (hereinafter, shortly referred to as an exposure apparatus as needed) 100 of the first embodiment.

Exposure apparatus 100 is a projection exposure apparatus by a step-and-scan method, which is a so-called scanner.

Exposure apparatus 100 is equipped with an exposure apparatus main body (hereinafter, shortly referred to as an apparatus main body as needed) 110, a plurality (e.g. four) of vibration isolation tables 130 on which exposure apparatus main body 110 is mounted, a plurality (a pair (two) in this case) of weight reduction apparatuses 150, and the like.

Apparatus main body 110 is equipped with an illumination system IOP, a mask stage MST that holds a mask M, a projection unit PU that includes a projection optical system PL, a substrate stage PST that holds a substrate P, a stage driving system 24 that drives substrate stage PST, a body on which mask stage MST, projection unit PU, substrate stage PST and the like are mounted, and the like. A main controller (the illustration is omitted) performs overall control over the respective components of apparatus main body 110.

In this specification, the explanation is given assuming that a direction in which mask M and substrate P are respectively scanned relative to projection optical system PL during exposure is an X-axis direction, a direction orthogonal to the X-axis direction within a horizontal plane is a Y-axis direction, and a direction orthogonal to the X-axis and the Y-axis is a Z-axis direction, and rotational (tilt) directions around the X-axis, Y-axis and Z-axis are $\theta x$, $\theta y$ and $\theta z$ directions, respectively.

Illumination system IOP is configured similar to the illumination system that is disclosed in, for example, U.S. Pat. No. 6,552,775 and the like. More specifically, illumination system IOP irradiates mask M with a light emitted from a mercury lamp (not illustrated), as an illumination light for exposure (illumination light) IL, via a reflection mirror, a dichroic mirror, a shutter, a wavelength selecting filter, various types of lenses and the like, which are not illustrated. As illumination light IL, for example, a light such as an i-line (with a wavelength of 365 nm), a g-line (with a wavelength of 436 nm) or an h-line (with a wavelength of 405 nm) (or a synthetic light of the i-line, the g-line and the h-line described above) is used.

Mask stage MST is placed on the −Z side of illuminations system IOP. On mask stage MST, mask M having a pattern surface (the lower surface in FIG. 1) on which a circuit pattern and the like are formed is fixed by, for example, vacuum adsorption.

Mask stage MST is driven in a scanning direction (the X-axis direction) with a predetermined stroke and also is finely driven in the Y-axis direction and the $\theta z$ direction, on a pair of mask stage guides 35, by a mask stage driving system (not illustrated) that includes, for example, a liner motor.

Projection unit PU includes the plurality of projection optical system PL and an optical surface plate 42 (see FIG. 4) on which the plurality of projection optical system PL are fixed (held), and is placed on the −Z side of mask stage MST.

Projection unit PU including projection optical system PL is supported by a frame caster 38, which is described later, below mask stage MST in FIG. 1. Projection optical system PL in the embodiment has a configuration similar to the projection optical system disclosed in, for example, U.S. Pat. No. 6,552,775. More specifically, projection optical system PL (multi-lens projection optical system) includes a plurality of projection optical systems whose projection areas of pattern images of mask M are placed in a zigzag shape, and functions equivalently to a projection optical system that has a single image field with a rectangular shape whose longitudinal direction is in the Y-axis direction. In the embodiment, as each of the plurality of projection optical systems, for example, a projection optical system that is a both-side telecentric equal-magnification system that forms an erected normal image is used. In the description below, the plurality of projection areas placed in a zigzag shape of projection optical system PL are also referred to as an exposure area as a whole.

Therefore, when an illumination area on mask M is illuminated with illumination light IL from illumination system IOP, by illumination light IL that has passed through mask M whose pattern surface is placed substantially coincident with the first plane (object plane) of projection optical system PL, a projected image (partial erected image) of a circuit pattern of mask M within the illumination area is formed on an irradiation area (exposure area) of illumination light IL, which is conjugate to the illumination area, on substrate P that is placed on the second plane (image plane) side of projection optical system PL and whose surface is coated with a resist (sensitive agent), via projection optical system PL. Then, by moving mask M relative to the illumination area (illumination light IL) in the scanning direction (X-axis direction) and also moving substrate P relative to the exposure area (illumination light IL) in the scanning direction (X-axis direction) by synchronous drive of mask stage MST and substrate stage PST, scanning exposure of one shot area (divided area) on substrate P is performed, and a pattern of mask M is transferred onto the shot area. More specifically, in the embodiment, a pattern of mask M is generated on substrate P by illumination system IOP and projection optical system PL, and the pattern is formed on substrate P by exposure of a sensitive layer (resist layer) on substrate P with illumination light IL.

As disclosed in, for example, U.S. Patent Application Publication No. 2008/0030702 and the like, the body is equipped with a base plate BS and frame caster 38 fixed on base plate BS.

Base plate BS is made up of a member having a rectangular parallelepiped shape (a rectangular plate shape that is thick), and its four corners are supported by vibration isolation tables 130 installed on a floor surface F, and base plate BS is separated from floor surface F in terms of vibration. Note that while only the two vibration isolation tables 130 are shown in FIG. 1, in practice, for example, the other two vibration isolation tables (which are hidden behind vibration isolation tables 130 in the depth of the page surface) are installed on floor surface F.

As shown in FIG. 1, substrate stage PST is arranged on the −Z side of projection unit PU, and holds substrate P by vacuum adsorption or the like via a substrate holder (not illustrated).

Stage driving system 24 includes a liner motor and the like, and drives substrate stage PST in the X-axis direction and the Y-axis direction with a predetermined stroke, and also finely drives the substrate stage in the Z-axis direction, the θx direction, the θy direction and the θz direction.

Frame caster 38 is placed on base plate BS so as to enclose substrate stage PST and stage driving system 24. Frame caster 38 is configured including a plurality of leg sections and a horizontal section that is supported by the plurality of leg sections and has a stepped opening section in the center. And, optical surface plate 42 of projection unit PU is supported by a stepped portion of the opening section at support points (e.g. hinged joint support sections) in a plurality of positions, e.g. in three positions.

Note that exposure apparatus main body 110 that includes substrate stage PST and stage driving system 24 described above is configured similar to the stage device that is disclosed in, for example, PCT International Publication No. 2008/129762 (the corresponding U.S. Patent Application Publication No. 2010/0018950) and the like.

The weight of apparatus main body 110 that is configured as described above is, for example, about 20 t.

A pair of weight reduction devices 150 are respectively placed on the −Y side and the +Y side of apparatus main body 110. The pair of weight reduction devices 150 are substantially the same devices except that they are arranged bilaterally symmetric within the page surface.

Each of weight reduction devices 150 has a frame 151 that is separated from apparatus main body 110, a pair of pulleys 153 attached to the upper section of frame 151, a rope 155 which is wrapped around the pair of pulleys 153 and both ends of which hang downward, and a weight 157 that is suspended from one end (an end farther from apparatus main body 110) of rope 155. In this case, the weight of weight 157 is, for example, 500 kg. Weight 157 is made up of a rectangular parallelepiped member whose longitudinal direction is in the X-axis direction.

Between weight 157 and frame 151, an LM guide (Linear Motion Guide) 159 used to smooth the vertical movement of weight 157 is arranged.

The other end (an end closer to apparatus main body 110) of rope 155 is tied to a hook 40 fixed to the leg section of frame caster 38. Note that hook 40 is fixed to the leg section of frame caster 38 via a vibration isolation rubber 160, as shown in FIG. 2 as an example. Note that, although the illustration is omitted in each of the drawings, the pair of pulleys 153, rope 155, LM guide 159, hook 40 and the like described above are placed plurally in the depth direction of the page surface (however, one each of weights 157 is placed for each of the two weight reduction devices 150).

As the material of rope 155, for example, a wire formed by twisted steel wires, a chain, a fiber sling such as polyester or aromatic polyamide series polymer can be used.

In exposure apparatus 100 configured as described above, the weight placed on vibration isolation tables' 130 is reduced by, for example, 1 t (500 kg×2).

As described above, each of the pair of weight reduction devices 150 which exposure apparatus 100 of the embodiment is equipped with has rope 155 wrapped around the pair of pulleys attached to the upper section of frame 151 that is separated from apparatus main body 110, and weight 157 is suspended at one end of rope 155 and the other end of rope 155 is tied to frame caster 38 of apparatus main body 110.

Accordingly, the weight placed on vibration isolation tables 130 can be less than the weight of apparatus main body 110. Consequently, even if the weight of apparatus main body 110 is increased owing to the size increase, the size of vibration isolation tables 130 does not have to be increased, and the coil springs do not have to additionally be arranged at vibration isolation tables 130. Thus, it becomes possible to increase the size of apparatus main body 110 with a simple configuration without inducing the cost rise.

Further, even in the case where the height of apparatus main body 110 is high and there is no effective space above the apparatus main body, the weight placed on vibration isolation tables 130 can be stably less than the weight of apparatus main body 110 by increasing the height of frame 151 and increasing the length of rope 155.

In this case, the transmission route of vibration becomes longer because the length of rope 155 is increased, and the vibration can be attenuated and also the stiffness in the lateral direction (oscillation direction) can be lowered. Therefore, when apparatus main body 110 oscillates in the front-back direction (the axis direction of pulleys 153, which is the X-axis direction in this case) owing to the action of vibration isolation tables 130, the contact positional relation between pulleys 153 and rope 155 does not significantly vary because the distance from the position of pulleys 153 to the end of rope 155 is long. Consequently, abrasion of rope 155 and pulleys 153 or dust generation can be suppressed.

Further, since hook 40 is fixed to the leg section of frame caster 38 via vibration isolation rubber 160, the vibration traveling from frame 151 to pulleys 153 and traveling from pulleys 153 to rope 155 can be absorbed by vibration isolation rubber 160 and prevented from entering apparatus main body 110.

Further, even if the positional relation between apparatus main body 110 and weight 157 changes owing to stretch of rope 155 or deformation of vibration isolation rubber 160 or the like over time, the reduced amount of the apparatus weight hardly varies except for the frictional force of pulleys 153 and the like. Therefore, the accuracy of the positional relation among weight 157, rope 155 and frame 151 can be rough and the assembly can be performed without difficulty.

Meanwhile, in the case where weight reduction is performed by additionally arranging the coil springs at the vibration isolation tables to support the exposure apparatus main body or suspending the exposure apparatus main body with the coil springs from the ceiling as in the conventional case, the force widely varies owing to the positions of the coil springs with respect to the exposure apparatus main body because the spring constant (which is equal to the stiffness) of the springs is large. More specifically, the reduced amount of the apparatus weight is not uniform. In exposure apparatus 100 of the embodiment, however, even if apparatus main body 110 oscillates in the vertical or lateral direction (in this case, in the Y-axis direction) owing to the action of vibration isolation tables 130, the position of weight 157 only vertically moves by rotation of pulleys 153, and the reduced amount of the apparatus weight does not vary. Further, since any coil springs are not used, sympathetic vibration of the apparatus main body and the vibration isolation tables is not generated, and the attenuation characteristic of the vibration isolation tables can also be improved.

Incidentally, in the embodiment above, while the case has been described where the end of each rope 155 that is closer to apparatus main body 110 is tied to hook 40 fixed to the leg section of frame caster 38, this is not intended to be limiting, and for example, the end can be tied to projection unit PU as in a second embodiment to be described next.

Further, in the embodiment above, the case has been described where the weight of weight 157 is, for example, 500 kg, the weight is not limited thereto.

Further, in the embodiment above, the case has been described where apparatus main body 110 is supported by the plurality of vibration isolation tables 130 and weight reduction device 150 reduces the weight of apparatus main body 100 that acts on vibration isolation tables 130. However, a supporting section that supports apparatus main body 110 from below is not limited to vibration isolation tables 130, but various configurations can be considered, and with any configuration which the supporting section employs, weight reduction device 150 can reduce the weight of apparatus main body 110 that acts on the supporting section.

Second Embodiment

Figure 3:
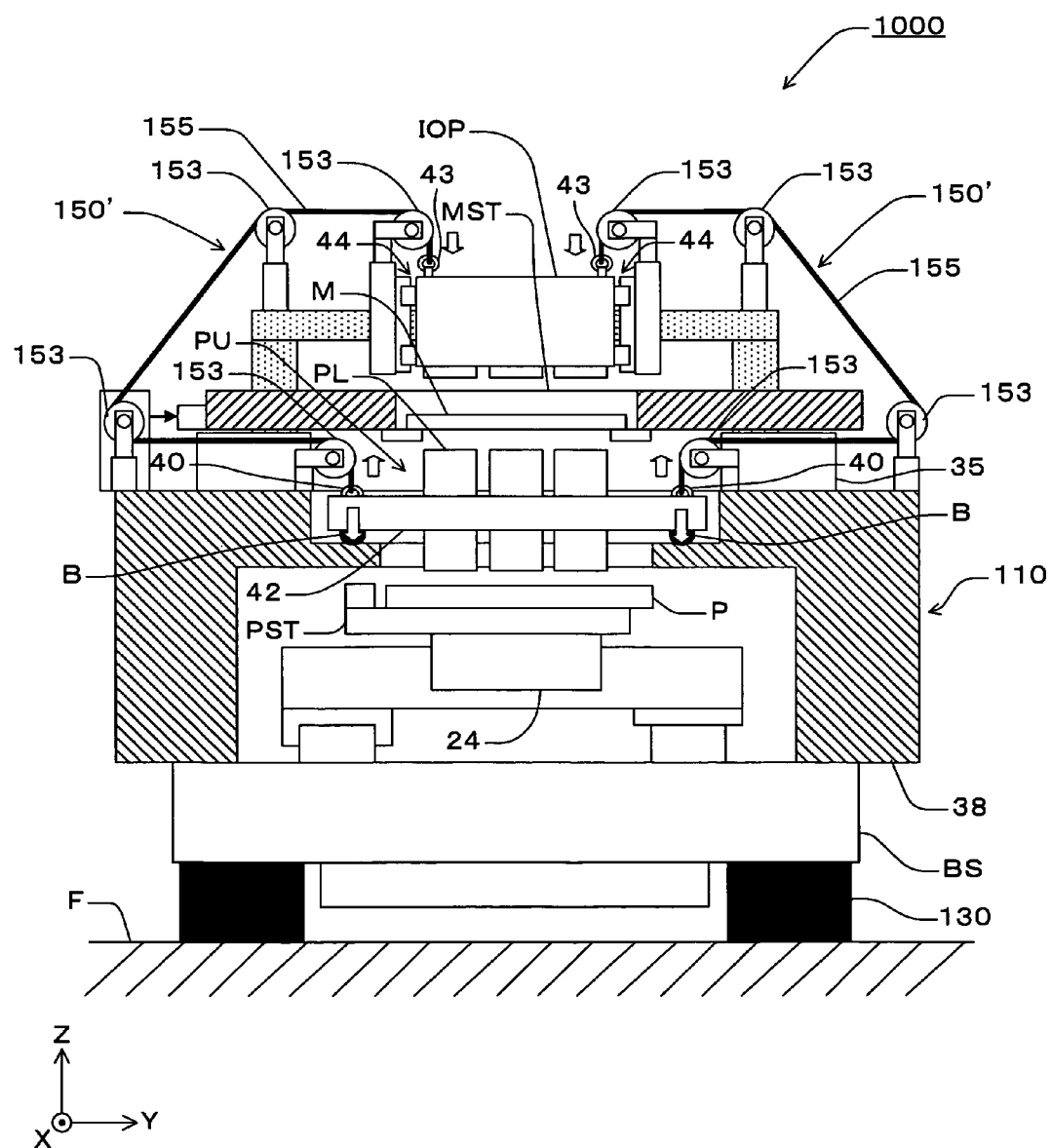
FIG. 3 is a view showing a schematic configuration of an exposure apparatus of a second embodiment.

Next, the second embodiment of the present invention is described with reference to FIG. 3. FIG. 3 shows a schematic configuration of an exposure apparatus 1000 of the second embodiment.

Exposure apparatus 1000 is a projection exposure apparatus by a step-and-scan method, which is a so-called scanner.

Exposure apparatus 1000 is configured similar to exposure apparatus 100 of the first embodiment described earlier except that a plurality (three in this case) of weight reduction devices 150' are arranged instead of a pair of weight reduction devices 150. In the description below, the different point from the first embodiment such as a configuration of the weight reduction device is mainly described. Incidentally, the reference signs that are the same as or similar to those of the first embodiment are used for components that are the same as or similar to those of the first embodiment and the description thereabout is omitted.

The three weight reduction devices 150' are substantially the same devices except that their placements are different. As shown in FIG. 3, each of weight reduction devices 150' has four pulleys 153 attached on exposure apparatus main body 110, rope 155 which is wrapped around pulleys 153. In this case, one ends of the respective ropes 155 are tied to hooks 43 fixed to the upper surface of illumination system IOP and the other ends are tied to hooks 40 fixed to the upper surface of optical surface plate 42 that configures a part of projection unit PU, in the vicinity of hinged joint support points B, which is described later on, arranged at three positions that support projection unit PU. As shown in FIG. 3, optical surface plate 42 is supported in the stepped portion of the opening section formed in a horizontal section of frame caster 38, by hinged joint support sections (hinged joint support points) B at a plurality of positions, in this case, three noncollinear positions (hinged joint support section B at one position of the three positions is not illustrated). These hinged joint support sections B at the three positions are placed so as to support optical surface plate 42 with substantially equal forces, and each have a structure in which many rotatable small balls are arranged between a large ball and a spherical surface receiver such that each of the support sections (each of the support points) is ratable but its translation is restricted. Note that, although the illustration is omitted in FIG. 3, pulleys 153, ropes 155, hooks 40 and the like described above are placed plurally in the depth direction of the page surface.

In this case, illumination system IOP is configured to be capable of moving only in the vertical direction (±Z direction) that is a direction of gravitational force by guides 44 that have rails and sliders arranged on the side surfaces of illumination system IOP. With this configuration, the empty weight of projection unit PU placed (acting) on the respective hinged joint support sections B that support optical surface plate 42 can be reduced without arranging an extra weight on apparatus main body 110, and the frictional force generated at the respective hinged joint support sections B is decreased. Consequently, in the case where apparatus main body 110 is deformed by movement of the stage device or the like, the local deformation of optical surface plate 42 is restrained because the respective hinged joint support sections B perform fine rotational motion without resistance even if the positions of hinged joint support sections Bat the three positions that support optical surface plate 42 vary, and therefore, optical surface plate 42 as a whole is only inclined to form a new attitude. Since the inclination amount of optical surface plate 42 as a whole can be obtained with high precision using, for example, an interferometer or the like, the position of the optical surface plate can be corrected without difficulty by the coordinate exchange of the stage position or the like.

Further, weight reduction devices 150' related to the present second embodiment can be flexibly placed by using ropes 155 and pulleys 153, which allows weight reduction devices 150' to be compactly configured with a low height, and therefore, the weight reduction devices can be configured without difficulty also in the case where there is a movable body such as a mask stage above the image-forming optical system.

Moreover, owing the effect of the weight reduction of weight reduction devices 150', at the same time, the weight placed on vibration isolation tables 130 that support apparatus main body 110 can also be reduced, and besides, since illumination system IOP is utilized as the heavy load, instead of a weight, it is possible to decrease the weight placed on vibration isolation tables 130 and downsize vibration isolation tables 130, compared with the case where a weight is separately arranged.

Further, since there is no concern in exposure apparatus 1000 of the present second embodiment that vibration travels from the outside to optical surface plate 42 through ropes 155, vibration isolation rubber 160 described above or the like does not have to be arranged at weigh reduction device 150'.

Further, according to exposure apparatus 1000 of the present second embodiment, even if ropes 155 stretch owing to temporal change or the like and the positional relation between apparatus main body 110 and illumination system IOP changes, the reduced amount of the apparatus weight hardly varies except for the frictional force of pulleys 153 and the like. Therefore, the accuracy of the positional relation between ropes 155 and illumination system IPO can be rough, and also the assembly can be performed without difficulty.

Further, in exposure apparatus 1000 of the present second embodiment, even if apparatus main body 110 oscillates in the vertical or lateral direction (in this case, in the Y-axis direction) owing to the action of vibration isolation tables 130, the position of illumination system IOP only vertically moves by rotation of pulleys 153, and the reduced amount of the apparatus weight does not vary. Further, since any coil springs are not used, sympathetic vibration of the apparatus main body and the vibration isolation tables is not generated, and the attenuation characteristic of the vibration tables can be improved. Incidentally, since the accuracy of the optical systems (optical components' placement) of illumination system IOP is rough compared with that of the image-forming system, variation in the relative position with the optical surface plate because of the apparatus deformation can be permitted.

Incidentally, in the case where the weight reduction device is connected to optical surface plate 42 as in exposure apparatus 1000 of the second embodiment, for example, hooks 40 to which ropes 155 are tied and the like should be attached to hinged joint support points B or to the three positions on the upper surface of optical surface plate 42 in the vicinity of hinged joint support points B.

Further, the plurality of pulleys 153 and the heavy load (illumination system IOP in the second embodiment above corresponds thereto) can be installed at apparatus main body 110 as in the second embodiment, or can be installed at another frame that is separated from apparatus main body 110 as in a first modified example to be described next. In the latter case, however, it is necessary to prevent disturbance such as vibration from entering the optical surface plate through the ropes or to restrain the entrance of the disturbance, for example, by arranging vibration isolation rubber 160 or the like.

FIRST MODIFIED EXAMPLE

Figure 4:
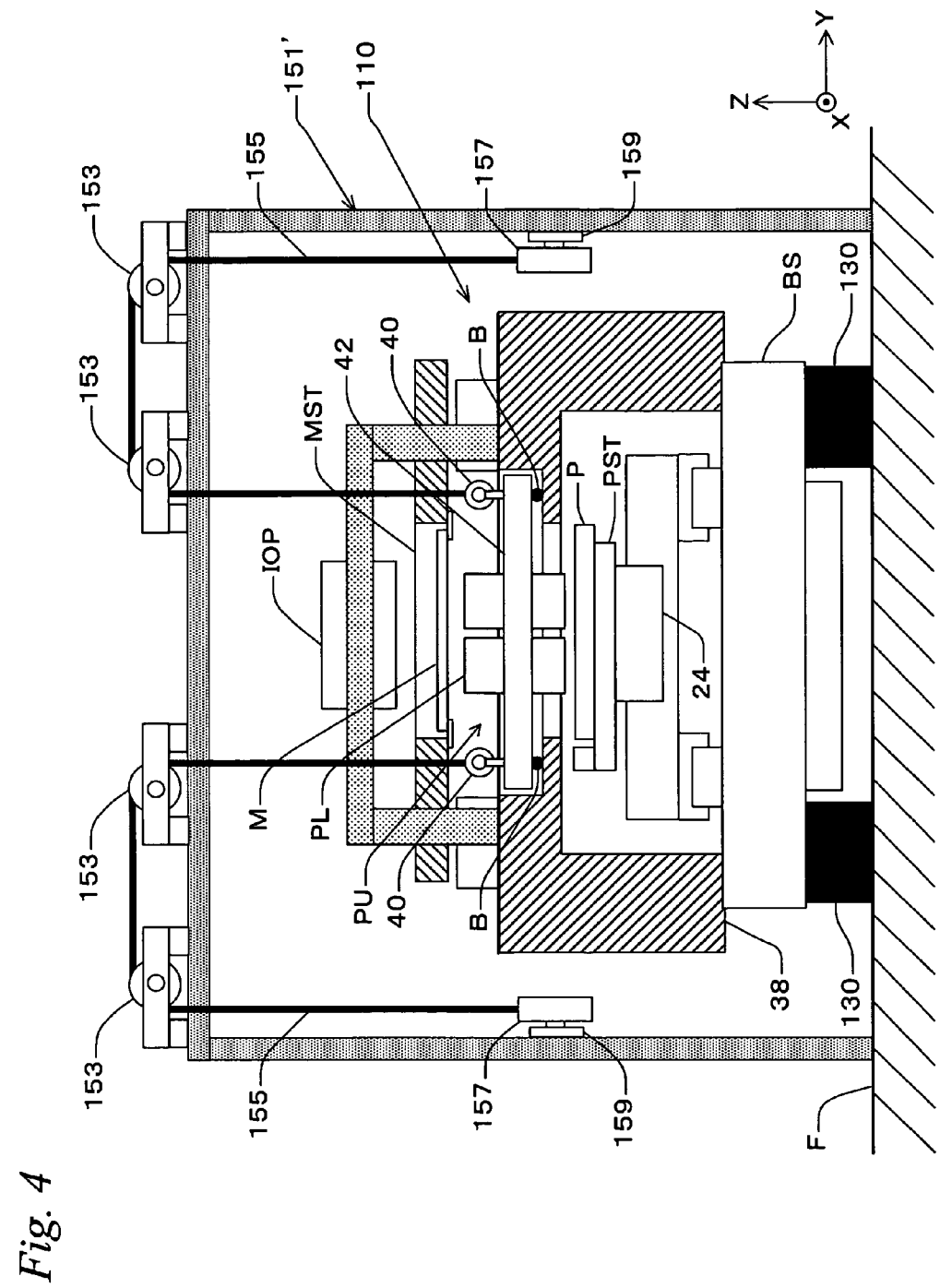
FIG. 4 is a view used to explain a first modified example of the second embodiment.

FIG. 4 shows the first modified example of the exposure apparatus of the second embodiment in which the weight reduction devices are connected to optical surface plate 42. In this first modified example, the mid portion of rope 155 which each weight reduction device is equipped with is wrapped around a pair of pulleys 153 attached to the upper portion of a portal frame 151' that is separated from apparatus main body 110, and both ends of rope 155 hang downward. And, weight 157 is suspended from one end (an end farther from apparatus main body 110) of rope 155 and the other end is tied to hook 40 fixed to the upper surface of optical surface plate 42 in the vicinity of hinged joint support section B placed at the three positions that supports projection unit PU, which is similar to the second embodiment.

Incidentally, in FIG. 4, while mask stage MST and ropes 155 are illustrated so as to overlap for the sake of simplification of the drawing, for example, opening sections can be formed at mask stage MST and ropes 155 can be inserted in the opening sections. Or, it is also possible that extra pulleys are additionally arranged so as to detour the ropes to prevent the ropes from coming in contact with the mask stage. Note that the weight of each weight 157 is at a level that is not enough to lift optical surface plate 42 (i.e. less than or equal to around the value obtained by dividing the weight of optical surface plate 42, on which a plurality of projection optical systems PL are held, by the number of weights). In this case, even if the frictional force owing to the empty weight of projection unit PU placed on hinged joint support sections B that support optical surface plate 42 is decreased and apparatus main body 110 deforms, optical surface plate 42 is hard to be locally deformed. Further, since the weight placed on vibration isolation tables 130 that support apparatus main body 110 is also decreased at the same time, the size of vibration isolation tables 130 can be decreased.

SECOND MODIFIED EXAMPLE

Figure 5:
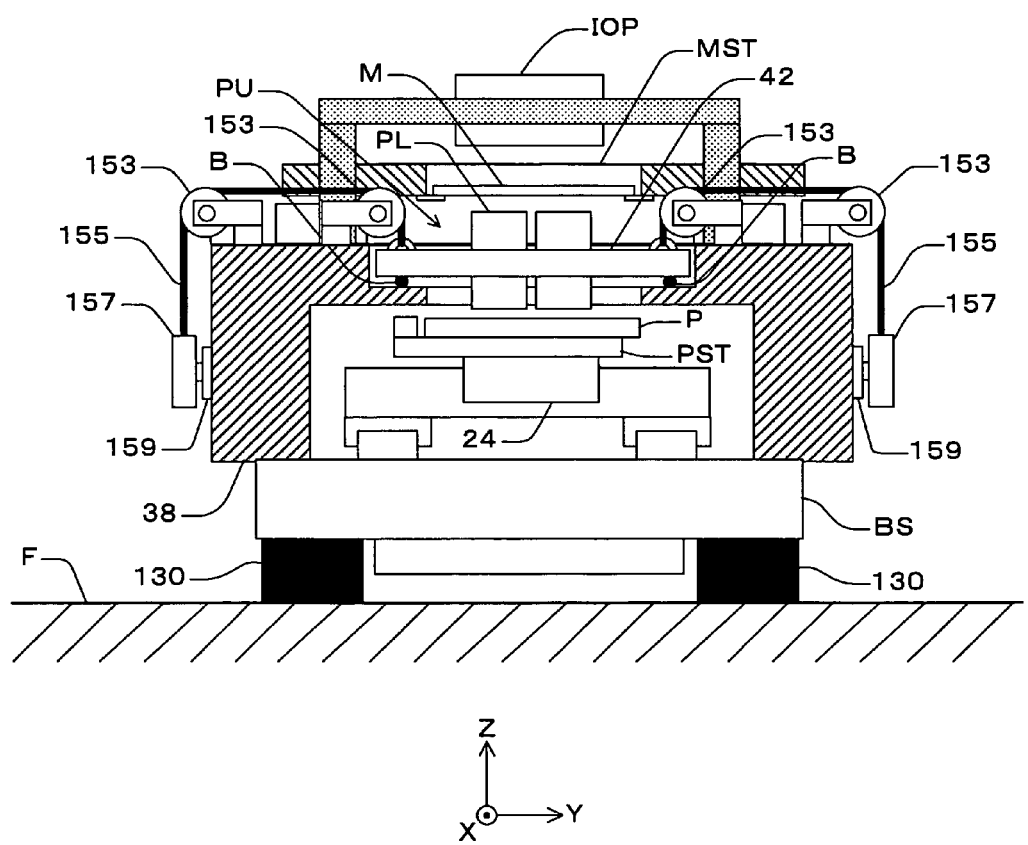
FIG. 5 is a view used to explain a second modified example of the second embodiment.

FIG. 5 shows a second modified example of the exposure apparatus of the second embodiment in which the weight reduction devices are connected to optical surface plate 42. In this second modified example, the plurality of pulleys 153 in the first modified example are fixed to the horizontal section of frame caster 38. In this case, the effect equivalent to the first modified example can be obtained, and besides, there is no concern that the vibration from the outside enters surface plate 42 through ropes 155.

Further, since pulleys 153 can be compactly placed at low positions, the weight reduction devices can be configured without difficulty also in the case where there is a movable body such as a mask stage above projection unit PU. Incidentally, pulleys 153 do not have to be fixed pulleys, but can be combined pulleys composed of fixed pulleys and moving pulleys, or differential pulleys or the like.

Third Embodiment

Figure 6:
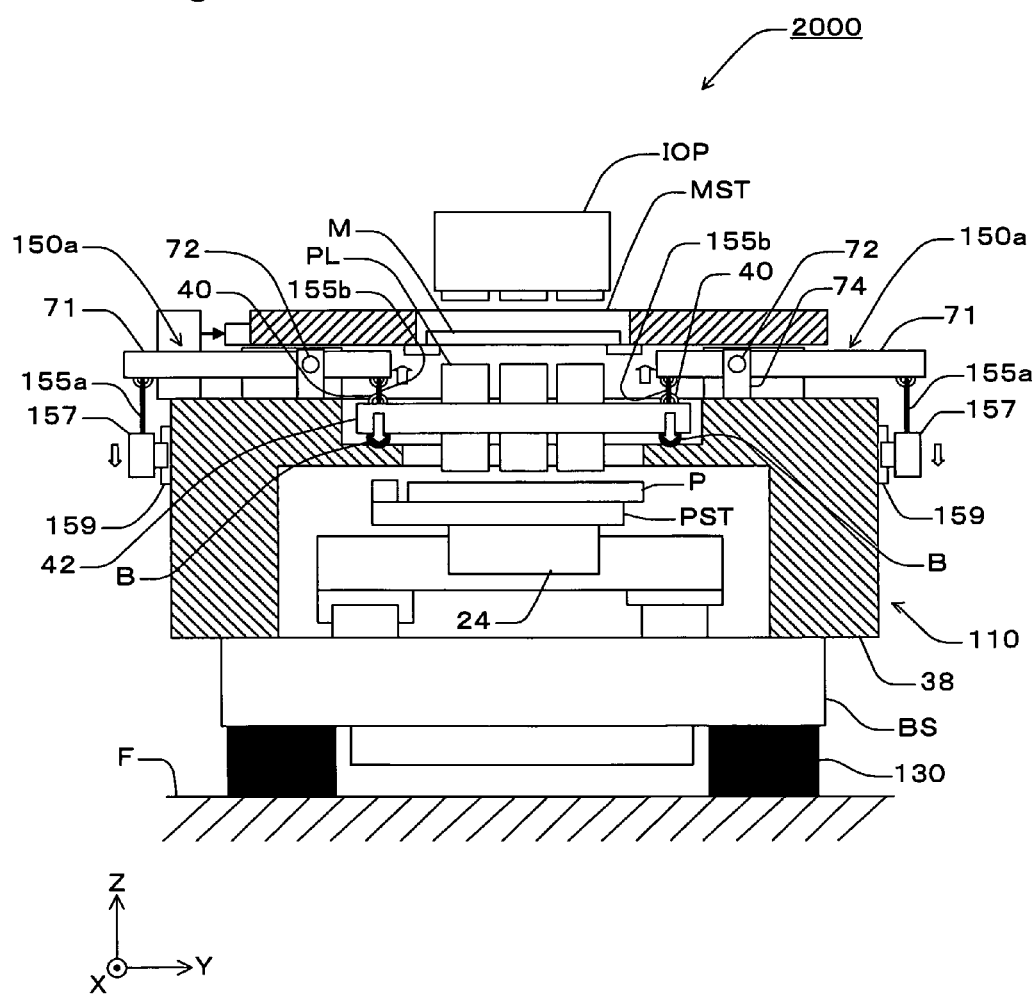
FIG. 6 is a view showing a schematic configuration of an exposure apparatus of a third embodiment.

Next, a liquid crystal exposure apparatus of a third embodiment is described using FIG. 6. The liquid crystal exposure apparatus of the third embodiment has a configuration similar to the liquid crystal exposure apparatus of the second embodiment described earlier except that the principle of lever, i.e. the balance of moment of force is utilized as the principle of weight reduction of the weight reduction devices and that guides 44 are not arranged on the side surfaces of illumination system IOP. In the description below, a configuration of the weight reduction device is mainly described. Incidentally, the reference signs that are the same as or similar to those of the first or second embodiment are used for components that are the same as or similar to those of the first or second embodiment and the description thereabout is omitted.

FIG. 6 schematically shows a configuration of a liquid crystal exposure apparatus 2000 of the third embodiment. Three weight reduction devices 150a which this liquid crystal exposure apparatus 2000 is equipped with are substantially the same devices except that their placements are different.

Each weight reduction device 150a is equipped with a lever 71 that is attached, via a support axis 72, to a bearing member 74 fixed to the upper surface of frame caster 38, a pair of ropes 155a and 155b one ends of which are tied to one end and the other end of lever 71 in the longitudinal direction, weight 157 that is suspended from the other end of rope 155a. In this case, lever 71 is attached to bearing member 74 via support axis 72 so as to be capable of turning (performing reciprocating rotation) in a state where the length of a portion on the projection optical system PL side is shorter than the length of a portion on the opposite side, with support axis 72 serving as a reference. Rope 155b has one end (upper end) that is connected to an end on the other end side (projection optical system PL side) of lever 71, and has the other end (lower end) is tied to hook 40 fixed to the upper surface of optical surface plate 42 in the vicinity of hinged joint support section B (hinged joint support section B at one position of three positions is not illustrated). Weight 157 suspended from the other end (lower end) of rope 155a is made up of a rectangular parallelepiped member whose longitudinal direction is in the X-axis direction. In this case, as weight 157, weight 157 with the optimal weight that is calculated from the leverage (lever ratio) is used.

LM guide (Linear Motion Guide) 159 used to vertically guide weight 157 (restrict the movement in directions other than the vertical direction) is fixed to frame caster 38. However, LM guide 159 does not necessarily have to be arranged, and weight 157 can be directly (without ropes) fixed to the one end of lever 71.

Note that, although the illustration is omitted in FIG. 6, ropes 155a and 155b, LM guide 159, hook 40 and the like described above are placed plurally in the depth direction of the page surface (however, one each of weights 157 is placed for each of weigh reduction devices 150a).

By employing such a configuration, the lifting force greater than the lever ratio can be obtained even if the weight of weight 157 is decreased. Further, different from the second embodiment, the configuration in which any pulleys are not used is employed, and therefore, various inconveniences caused by the frictional force between the pulleys and the ropes can be resolved. To be specific, movement (reaction) of weights 157 with respect to displacement of hinged joint support sections B becomes quicker, and variation in the lifting force (upward cancelling force) of optical surface plate 42 owing to the frictional force is lessened. Consequently, deformation of optical surface plate 42 because of variation in the placed force is decreased, and variation in optical performance is lessened. Furthermore, dust generation is reduced since there is no friction between the pulleys and the ropes.

Further, lever 71 and optical surface plate 42 can be connected and lever 71 and weight 157 can be connected, respectively, via a bar-like member or a plate-like member with a structure in which both ends of the member are rotatable, and the like, instead of the connection via the ropes. With this arrangement, the inconveniences caused by stretch or fracture of ropes 155a and 155b can be resolved.

Further, in the case where the vibration transmission from the outside can be cut off, bearing members 74 that support levers 71 (and weights 157) can be attached to another frame that is separated from exposure apparatus main body 110.

Fourth Embodiment

Next, a liquid crystal exposure apparatus of a fourth embodiment is described with reference to FIGS. 7 and 8. The liquid crystal exposure apparatus of the fourth embodiment has a configuration similar to the liquid crystal exposure apparatus of the second embodiment described earlier except that the balance of moment of force by a two-stage lever is utilized for the weight reduction devices. In the description below, a configuration of the weight reduction device is mainly described. Incidentally, the reference signs that are the same as or similar to those of the first or second embodiment are used for components that are the same as or similar to those of the first or second embodiment and the description thereabout is omitted.

Figure 7:
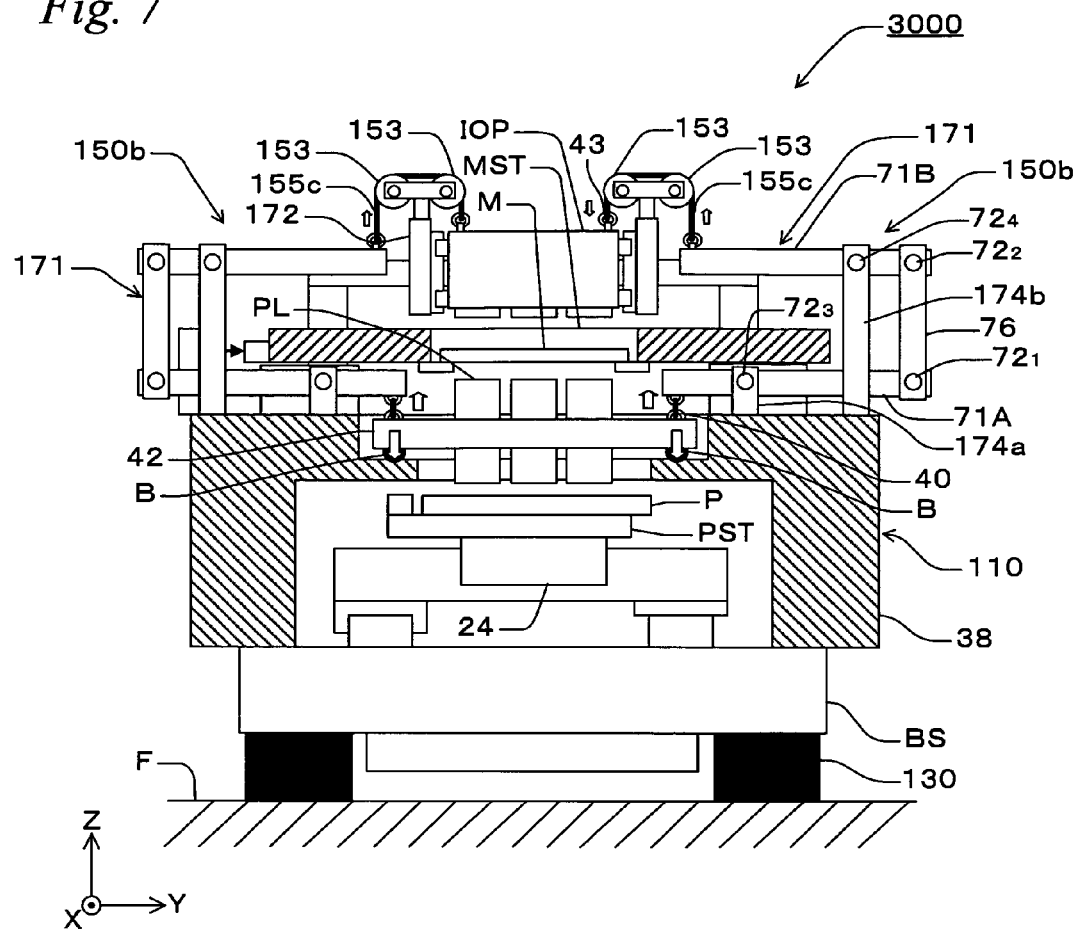
FIG. 7 is a view showing a schematic configuration of an exposure apparatus of a fourth embodiment.

FIG. 7 schematically shows a configuration of a liquid crystal exposure apparatus 3000 of the fourth embodiment. Three weight reduction devices 150b which this liquid crystal exposure apparatus 3000 is equipped with are substantially the same devices except that their placements are different.

As shown in FIG. 7, each weight reduction device 150b is equipped with a two-stage lever 171 fixed to the upper surface of frame caster 38, a pair of pulleys 153 attached to the upper end of a support member 172 fixed to the upper surface of frame caster 38, and a rope 155c one end of which is tied to one end (a point of effort) of two-stage lever 171. Rope 155c is wrapped around the pair of pulleys 153, and the other end of rope 155c is tied to hook 43 fixed to the upper surface of illumination system IOP.

Two-stage lever 171 has a first lever 71A that is attached to a first bearing member 174a fixed to the upper surface of frame caster 38 so as to be capable of turning (performing reciprocating rotation), a second lever 71B that is attached to a second bearing member 174b fixed to the upper surface of frame caster 38 so as to be capable of turning (performing reciprocating rotation) at a position higher than first lever 71A, a link member 76 one end (lower end) of which is connected to one end of first lever 71A via a support axis $72_1$ and the other end (upper end) of which is connected to one end of second lever 71B via a support axis $72_2$. In this case, as shown in FIG. 4, link member 76 is in a state parallel to the Z-axis when first lever 71A and second lever 71B are both in a state parallel to the upper surface of frame caster 38.

Two-stage lever 171 has a point of load, i.e. the other end of first lever 71A (the end on the projection optical system PL side) that is connected, via a very short rope or the like, to hook 40 fixed to the upper surface of optical surface plate 42 in the vicinity of hinged joint support section B (hinged joint support section B at one position of three positions is not illustrated).

First lever 71A is supported by first bearing member 174a via a support axis $72_3$ so as to be capable of turning (performing reciprocating rotation) in a state where the length of a portion on the projection optical system PL side is shorter than the length of a portion on the opposite side, with support axis $72_3$ serving as a reference, and second lever 71B is supported by second bearing member 174b via a support axis $72_4$ so as to be capable of turning (performing reciprocating rotation) in a state where the length of a portion on the projection optical system PL side is longer than the length of a portion on the opposite side, with support axis $72_4$ serving as a reference.

Figure 8:
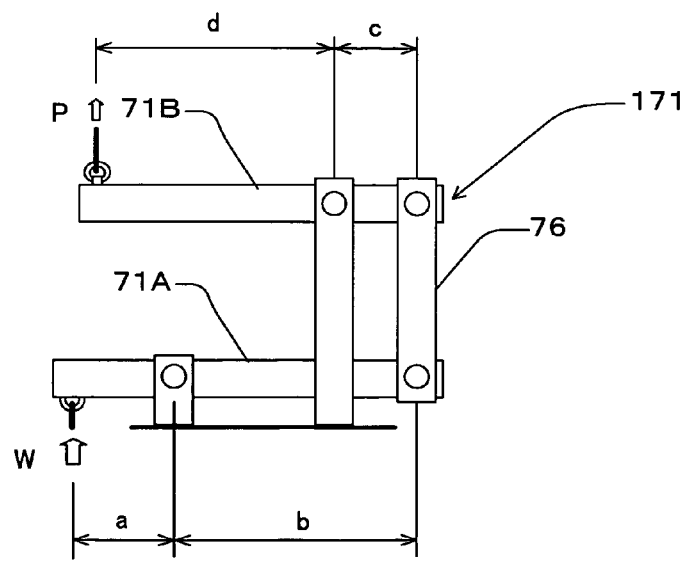
FIG. 8 is a view used to explain an action principle of a two-stage lever used in the fourth embodiment.

Two-stage lever 171 is extracted and shown in FIG. 8. As shown in FIG. 8, when the lengths of the respective portions of first lever 71A and second lever 71B are denoted by a, b, c and d, the relation in the following formula holds.

$$\frac{W}{P} = \frac{b}{a} \times \frac{d}{c}$$

In this case, for example, if a=100 mm, b=700 mm, c=200 mm, d=600 mm and P=5 kgf, then W=7×3×5=105 kgf.

As described above, since the lever ratio of two-stage lever 171 can be more enlarged compared with that of lever 71 described earlier, a strong upward force can be made to act on optical surface plate 42 with a smaller weight.

Note that, although the illustration is omitted in FIG. 7, pulleys 153, rope 155c, hook 40 and the like described above are placed plurally in the depth direction of the page surface.

The configuration of the other sections is similar to those of the second embodiment described previously, which includes the point that illumination system IOP can move only in the vertical direction (±Z direction), which is a direction of gravitational force, by guides 44 that have rails and sliders arranged on the side surfaces of illumination system IOP.

With the configuration as described above, according to weight reduction devices 150b and liquid crystal exposure apparatus 3000 equipped with the weight reduction devices related to the present fourth embodiment, the effect equivalent to the second embodiment described earlier can be obtained. In addition, since the lever is used similarly to the third embodiment described above, the effect equivalent to the third embodiment described above can be obtained in this regard. Furthermore, since the lever ratio of two-stage lever 171 can be more enlarged compared with lever 71 described earlier, a strong upward force can be made to act on optical surface plate 42 with a smaller weight in the present fourth embodiment, and accordingly the weight acting on hinged joint support sections B of optical surface plate 42 can decreased efficiently even when compared with the third embodiment, and hence, it becomes possible to restrain occurrence of local deformation of optical surface plate 42.

Further, since pulleys 153 are placed above illumination system IOP, the weight reduction devices can be configured without difficulty even in the case where there is a movable body such as mask stage MST above projection optical system PL. Incidentally, pulleys 153 do not have to be fixed pulleys, but can be combined pulleys composed of fixed pulleys and moving pulleys, or differential pulleys or the like.

Incidentally, while lever 71 or two-stage lever 171 is used in the weight reduction device in the third or fourth embodiment above, it is also possible to make a force stronger than the sum of the weight of the heavy load (weight 157 or illumination system IOP) act on optical surface plate 42 upward in a similar manner using pulleys, instead of these levers (this can also be applied to the first embodiment, in the same manner).

Further, in the second to fourth embodiments described above, the sum of the weight of the heavy load (weight 157 or illumination system IOP) or the sum of the upward force is preferably less than or equal to around the weight of optical surface plate 42 on which the plurality of projection optical systems PL are held. In this case, the weight (sum) of the heavy load (e.g. weight 157 in the case of the third embodiment) can be determined taking friction of pulleys or the like into consideration. Here, in the case of using pulleys (moving pulleys as an example), or as is obvious when the principle of lever is considered, the sum of the weight of the heavy load and the sum of the upward force acting on optical surface plate 42 are not always the same.

Further, in the second to fourth embodiments and the modified examples thereof described above, in the case of connecting the weight reduction devices to optical surface plate 42, hooks 40 used to tie ropes 155 and the like are installed at hinged joint support points (hinged joint support section) B or at three positions on the upper surface of optical surface plate 42 in the vicinity of the hinged joint support points, but this is an example and hooks 40 and the like can be installed apart from hinged joint support points B. Especially, hooks 40 and the like can be installed on the inner side from hinged joint support points B.

Incidentally, in each of the first to fourth embodiments above (hereinafter, described as each of the embodiments above), while the ropes or the combination of the ropes and the pulleys are used, this is not intended to be limiting, and for example, chains or belts can be used instead of the ropes, or a link mechanism can be used instead of the combination of the ropes and the pulleys.

Incidentally, the optical surface plate is also called a metrology frame. Further, at the optical surface plate (metrology frame) on which one or a plurality of projection optical systems (projection systems) are held, another optical member (e.g. a part of or entirety of at least one of a mark detecting system that detects alignment marks used in alignment of substrate P, and an encoder system or an interferometer system that measures the position of substrate stage PST) that is different from the projection system(s) can be arranged. To arrange heads or scales as the part of the encoder system, or to arrange at least a part of an optical unit as the part of the interferometer system on the optical surface plate (metrology frame) can be cited as an example. Besides, particularly in the case of a liquid immersion exposure apparatus to be described later on, a part or entirety of a nozzle unit can be attached to the optical surface plate (metrology frame).

Further, in each of the embodiments above, while the case has been described where the exposure apparatus is the scanning type exposure apparatus, this is not intended to be limiting, and for example, the exposure apparatus can be a static type exposure apparatus. Further, the exposure apparatus can be a reduction projection exposure apparatus by a step-and-stitch method that synthesizes a shot area and a shot area, an exposure apparatus by a proximity method, a mirror projection aligner or the like. Furthermore, the exposure apparatus can be a multi-stage type exposure apparatus equipped with a plurality of stage devices (e.g. refer to U.S. Pat. No. 6,590,634, U.S. Pat. No. 5,969,441 and U.S. Pat. No. 6,208,407). Further, the exposure apparatus can be an exposure apparatus equipped with a measurement stage including measurement members (e.g. a fiducial mark and/or a sensor) that is separately arranged from a stage that holds a substrate (e.g. refer to PCT International Publication No. 2005/074014).

Further, the magnification of projection optical system PL in each of the embodiments above is not only an equal magnifying system, but also can be either a reduction system or a magnifying system. And, projection optical system PL is not only a dioptric system, but also can be either a catoptric system or a catadioptric system, and in addition, the projected image can be either an inverted image or an erected image.

Further, an empty-weight cancelling device as disclosed in, for example, PCT International Publication No. 2008/129762 (the corresponding U.S. Patent Application Publication No. 2010/0018950) can be arranged in the apparatus main body in each of the embodiments above.

Further, in each of the embodiments above, while the case has been described where projection optical system PL is a projection optical system by a multi-lens method that is equipped with a plurality of projection optical systems, the number of the projection optical systems is not limited thereto, and there should be one or more projection optical units. Especially in the first embodiment, projection optical system PL is not limited to the projection optical system by a multi-lens method, but for example, can be a projection optical system that uses a large-size mirror of the Offner type, or the like. And, in the second embodiment and the like, projection optical system PL should be equipped with a plurality of optical members fixed to the optical surface plate in a predetermined positional relation.

Further, the light source of the exposure apparatus in each of the embodiments above is not limited to in particular, and a pulsed laser light source such as an ArF excimer laser (an output wavelength: 193 nm), a KrF excimer laser (an output wavelength: 248 nm), an $F_2$ laser (an output wavelength: 157 nm), an $Ar_2$ laser (an output wavelength: 126 nm) and a $Kr_2$ laser (an output wavelength: 146 nm) can also be used. And, a solid-state laser (an output wavelength: 355 nm, 266 nm) and the like can be used, or a harmonic wave generator of YAG laser can also be used. Besides, a harmonic wave, which is obtained by amplifying a single-wavelength laser beam in the infrared or visible range emitted by a DFB semiconductor laser or fiber laser with a fiber amplifier doped with, for example, erbium (or both erbium and ytterbium), and by converting the wavelength into ultraviolet light using a non-linear optical crystal, can also be used as vacuum ultraviolet light (e.g. refer to U.S. Pat. No. 7,023,610).

Further, in each of the embodiments above, while the case has been described where a projection optical system whose projection magnification is equal magnification is used as projection optical system PL, this is not intended to be limiting, and the projection optical system can be either a reduction system or a magnifying system.

Further, in each of the embodiments above, the illumination light of the exposure apparatus is not limited to the light having a wavelength more than or equal to 100 nm, but the light having a wavelength less than 100 nm can also be used. For example, each of the embodiments above can be applied to an EUV (Extreme Ultraviolet) exposure apparatus that uses an EUV light in a soft X-ray range (e.g. a wavelength range from 5 to 15 nm). In addition, each of the embodiments above can also be applied to an exposure apparatus that uses charged particle beams such as an electron beam or an ion beam.

Incidentally, it is especially effective to apply the exposure apparatus in each of the embodiments above to an exposure apparatus that exposes a substrate with a size (which includes at least one of an outer diameter, a diagonal line and a side) not less than 500 mm, for example, a large substrate for a flat-panel display (FPD), such as a liquid crystal display element.

Further, the application of the exposure apparatus is not limited to the exposure apparatus for liquid crystal display elements in which a liquid crystal display element pattern is transferred onto a rectangular glass plate, but each of the embodiments above can also be widely applied, for example, to an exposure apparatus for manufacturing semiconductors, and an exposure apparatus for producing thin-film magnetic heads, micromachines, DNA chips, and the like. Further, each of the embodiments above can be applied not only to an exposure apparatus for producing microdevices such as semiconductor devices, but can also be applied to an exposure apparatus in which a circuit pattern is transferred onto a glass substrate, a silicon wafer or the like to produce a mask or a reticle used in a light exposure apparatus, an EUV exposure apparatus, an X-ray exposure apparatus, an electron-beam exposure apparatus, and the like. Incidentally, an object that is subject to exposure is not limited to a glass plate, but for example, can be another object such as a wafer, a ceramic substrate, a film member, or a mask blank. Further, each of the embodiments above can also be applied to an exposure apparatus such as a liquid immersion type exposure apparatus in which a space between a projection optical system and a wafer is filled with a liquid, which is disclosed in, for example, U.S. Patent Application Publication No. 2005/0259234 and the like, as an exposure apparatus to transfer a circuit pattern onto a silicon wafer or the like.

Incidentally, in each of the embodiments above, a light transmissive type mask is used, which is obtained by forming a predetermined light-shielding pattern (or a phase pattern or a light-attenuation pattern) on a light transmissive mask substrate. Instead of this mask, however, as disclosed in, for example, U.S. Pat. No. 6,778,257, an electron mask (a variable shaped mask) on which a light-transmitting pattern, a reflection pattern, or an emission pattern is formed according to electronic data of the pattern that is to be exposed, for example, a variable shaped mask that uses a DMD (Digital Micromirror Device) that is a type of a non-emission type image display element (which is also called a spatial light modulator) can also be used.

Further, as disclosed in, for example, PCT International Publication No. 2001/035168, each of the embodiments above can also be applied to an exposure apparatus (a lithography system) in which line-and-space patterns are formed on a wafer by forming interference fringes on the wafer.

Moreover, each of the embodiments above can also be applied to an exposure apparatus that synthesizes two mask patterns on a substrate via a projection optical system and substantially simultaneously performs double exposure of one shot area on the substrate by one scanning exposure (e.g. refer to U.S. Pat. No. 6,611,316).

Incidentally, an object on which a pattern is to be formed (an object subject to exposure on which an energy beam is irradiated) in each of the embodiments above is not limited to a substrate (a glass plate), but may be another object such as a wafer, a ceramic substrate, a film member, or a mask blank.

Further, each of the embodiments above can appropriately be combined except for the case where the combination is unreasonable judging from their natures. Further, each of the embodiments above can suitably be applied not only to the exposure apparatus but also to the other substrate processing apparatuses and the like.

Electron devices such as liquid crystal display elements and semiconductor devices are manufactured through the following steps: a step where the function/performance design of a device is performed; a step where a mask based on the design step is manufactured; a step where a substrate is manufactured from a glass plate; a lithography step where a pattern of the mask is transferred onto the substrate with the exposure apparatus (pattern formation apparatus) of each of the embodiments above; a development step where the exposed substrate is developed; an etching step where an exposed member of an area other than an area where resist remains is removed by etching; a resist removing step where the resist that is no longer necessary when the etching is completed is removed; a device assembly step (including a dicing process, a bonding process, and a packaging process); an inspection step; and the like. In this case, in the lithography step, device patterns are formed on the substrate using the exposure apparatus in each of the embodiments above, and therefore, the devices with a high integration degree can be manufactured with high productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam and forms a pattern on the object, the apparatus comprising:
    an exposure apparatus main body that performs exposure of the object; and
    a weight reduction device, a part of which is connected to a supported section that includes at least a part of the exposure apparatus main body, and which generates a lifting force to lift the supported section upward by making use of an empty weight of a heavy load, and reduces a weight acting on a supporting section that supports the supported section from below.

2. The exposure apparatus according to claim 1, wherein the weight reduction device reduces the weight acting on the supporting section while maintaining contact between the supported section and the supporting section.

3. The exposure apparatus according to claim 1, wherein the lifting force to lift the supported section upward is less than or equal to around a weight of the supported section.

4. The exposure apparatus according to claim 1, wherein the supporting section restrains displacement of the supported section within a horizontal plane.

5. The exposure apparatus according to claim 1, wherein the weight reduction device includes the heavy load that has a weight corresponding to the weight to be reduced, and at least one long connecting member that has one end and the other end respectively connected to the heavy load and the supported section and has a mid portion on which a predetermined tensile force is given such that the weight of the heavy load serves as the lifting force.

6. The exposure apparatus according to claim 5, wherein the other end of the at least one connecting member is connected to the supported section via a vibration isolation member.

7. The exposure apparatus according to claim 5, wherein the at least one connecting member has a mid portion in a longitudinal direction that is wrapped around an intermediate support member placed separately from the exposure apparatus main body.

8. The exposure apparatus according to claim 7, wherein the intermediate support member has one or a plurality of pulleys, and
    the at least one connecting member has the mid portion that is wrapped around the pulleys.

9. The exposure apparatus according to claim 5, wherein
the supporting section is arranged at a part of the exposure apparatus main body, and
the at least one connecting member has the other end that is connected to the supported section, and the mid portion that is wrapped around an intermediate support member arranged at the part of the exposure apparatus main body where the supporting section is arranged.

10. The exposure apparatus according to claim 9, wherein
the intermediate support member has one or a plurality of pulleys, and
the at least one connecting member has the mid portion that is wrapped around the pulleys.

11. The exposure apparatus according to claim 5, wherein
the at least one connecting member is made up of any one of a wire formed by twisted steel wires, a chain and a belt formed by a synthetic resin material.

12. The exposure apparatus according to claim 1, wherein
the weight reduction device has the heavy load that has a weight corresponding to the weight to be reduced, and a lever mechanism that has one end serving as a point of effort and the other end serving as a point of load that are respectively connected to the heavy load and the supported section, and enlarges the weight of the heavy load in accordance with a lever ratio.

13. The exposure apparatus according to claim 12, wherein the lever mechanism is a two-stage lever mechanism.

14. The exposure apparatus according to claim 12, wherein
the lever mechanism has the one end connected to the heavy load via a connecting member.

15. The exposure apparatus according to claim 14, wherein
the connecting member has one end connected to the lever mechanism and the other end connected to the heavy load via a pulley.

16. The exposure apparatus according to claim 14, wherein
the connecting member is made up of any one of a wire formed by twisted steel wires, a chain and a belt formed by a synthetic resin material.

17. The exposure apparatus according to claim 1, wherein
the supporting section includes a vibration isolation device that supports the supported section from below.

18. The exposure apparatus according to claim 1, wherein
the supported section is supported at a plurality of support points by the supporting section, and
a plurality of the weight reduction devices are provided so as to correspond to the number of the plurality of support points, and a part of each of the plurality of the weight reduction devices is connected to the supported section at each of a plurality of positions that correspond to the plurality of support points.

19. The exposure apparatus according to claim 18, wherein each of the plurality of support points is a hinged joint support point.

20. The exposure apparatus according to claim 1, wherein
the supported section includes an optical surface plate on which an optical member is mounted.

21. The exposure apparatus according to claim 20, wherein the optical member includes a projection system.

22. The exposure apparatus according to claim 21, wherein
the projection system includes a plurality of optical systems placed in a predetermined positional relation.

23. The exposure apparatus according to claim 1, wherein
the supported section includes a metrology frame on which an optical system to project the energy beam on the object is mounted.

24. The exposure apparatus according to claim 1, wherein
the heavy load is a part of the exposure apparatus main body.

25. The exposure apparatus according to claim 1, wherein
the object is a substrate with a size not less than 500 mm.

26. A device manufacturing method, comprising:
exposing an object using the exposure apparatus according to claim 1; and
developing the object that has been exposed.

27. A flat-panel display manufacturing method, comprising:
exposing a substrate for a flat-panel display using the exposure apparatus according to claim 1; and
developing the substrate that has been exposed.

* * * * *